United States Patent [19]

Numai

[11] Patent Number: 5,469,458
[45] Date of Patent: Nov. 21, 1995

[54] SURFACE-EMITTING SEMICONDUCTOR DEVICE

[75] Inventor: Takahiro Numai, Tokyo, Japan

[73] Assignee: NEC Corporation, Tokyo, Japan

[21] Appl. No.: 154,472

[22] Filed: Nov. 19, 1993

[30] Foreign Application Priority Data

Nov. 27, 1992 [JP] Japan ................................. 4-318710

[51] Int. Cl.⁶ ................................................. H01S 3/19
[52] U.S. Cl. ........................................ 372/45; 372/27
[58] Field of Search ........................... 372/45, 46, 27, 372/96

[56] References Cited

U.S. PATENT DOCUMENTS

| | | | |
|---|---|---|---|
| 5,012,486 | 4/1991 | Luryi et al. | 372/45 |
| 5,170,407 | 12/1992 | Schubert et al. | 372/96 |
| 5,208,820 | 5/1993 | Kurihara et al. | 372/45 |
| 5,255,278 | 10/1993 | Yamanaka | 372/45 |
| 5,331,654 | 7/1994 | Jewell et al. | 372/18 |
| 5,345,462 | 9/1994 | Choquette | 372/45 |

FOREIGN PATENT DOCUMENTS 1-265584  10/1989  Japan .

OTHER PUBLICATIONS

"Surface Emitting Semiconductor Lasers", *IEEE Journal of Quantum Electronics*, Kenichi Iga et al. vol. 24, No. 9, Sep. 1988, pp. 1845–1855.

"Surface–emitting laser operation in vertical–to–surface transmission electrophotonic devices with a vertical cavity", *Applied Physics Letters*, T. Numai et al., vol. 58, Mar. 25, 1991, pp. 1250–1252.

*Primary Examiner*—James W. Davie
*Attorney, Agent, or Firm*—Young & Thompson

[57] ABSTRACT

A surface-emitting semiconductor device having an improved definition of polarization direction of a laser light emitted. The device contains a semiconductor substrate having a surface inclined to its (100)-plane, a first semiconductor cladding layer of a first electroconduction type formed directly or through a semiconductor layer on the surface of the substrate, a semiconductor active layer formed on the first semiconductor cladding layer, and a second semiconductor cladding layer of a second electroconduction type opposite in polarity to the first electroconduction type which is formed on the semiconductor active layer. The active layer is different in lattice constant from at least one of the first and second cladding layers. A laser beam is emitted in the direction approximately perpendicular to the surface of the substrate. Preferably, an optical waveguide formed by the active layer and first and second cladding layers has a rectangular cross-section parallel to the surface of the substrate.

16 Claims, 3 Drawing Sheets

SURFACE-EMITTING SEMICONDUCTOR DEVICE

BACKGROUND OF THE INVENTION

1. Field of the Invention

The present invention relates to a surface-emitting semiconductor device used as a light source in optical transmission and optical information processing and more particularly, to a surface-emitting semiconductor device in which the polarization direction of a light-output emitted is confined to one direction.

2. Description of the Related Art

Recently, research has progressed on semiconductor lasers used as a light source in the optical transmission and optical information processing fields. Among the semiconductor lasers, a surface-emitting semiconductor laser features as follows;

(1) Monolithic formation of the cavity is possible, (2) Test of the lasers can be made in a semiconductor wafer unit before separation into chips, (3) Dynamic single wavelength operation is expected, (4) A large radiation area and a narrow circular optical beam are possible, (5) A densely packed two-dimensional laser array can be provided, and (6) Three-dimensional laser array device can be integrated by layered structures.

Iga and other researchers played a leading role in the research of the surface-emitting semiconductor laser, which are summarized including its historical aspect in the report by Iga and et al in "Journal of Quantum Electronics" Vol 24, P. 1845, September 1988.

Such surface-light-emitting optoelectronic functional devices that make the best use of advantages of the surface-light-emitting semiconductor devices as shown above are expected to make the two-dimensional parallel optical information process possible for large-capacity information processes. A vertical-to-surface transmission electrophotonic device with a vertical-cavity, which is one type of the surface-light-emitting optoelectronic functional device, is disclosed in detail in the report by Numai in "Applied Physics Letters", Vol. 58, P. 1250, March 1991.

The conventional surface-emitting semiconductor devices described above, however, give rise to the following problems as:

First, since the optical waveguide is not provided along the travelling direction of light, the polarization direction of an output laser beam is determined depending on a difference in loss or gain in the cavity due to a slight asymmetry of the device structure. As a result, uniformity of the polarization direction of the device cannot be made.

Furthermore, when the surface-emitting semiconductor device is optically coupled with any other optical circuit element, it is required to confined the polarization direction of the laser beam emitted to a specific direction in order to improve the coupling efficiency.

In order to solve the above-mentioned problem about the coupling efficiency, an example of a surface-emitting semiconductor laser is disclosed in the Japanese Non-Examined Patent Publication No. 1-265584, in which a dielectric optical waveguide with a rectangular cross-section perpendicular to its light emitting direction is provided in cladding layers. Due to the rectangular cross-section of the waveguide the polarization direction is confined to a specific direction, however, this semiconductor laser cannot provide a satisfactory polarization characteristic and therefore, a satisfactorily high optical coupling efficiency cannot be obtained.

SUMMARY OF THE INVENTION

In consideration of the above-mentioned problems, an object of the present invention is to provide a surface-light-emitting semiconductor device in which definition of the polarization direction of a laser beam emitted can be improved.

A surface-light-emitting semiconductor device according to the present invention comprises a semiconductor substrate having a surface inclined to the (100)-plane, a first semiconductor cladding layer of a first electroconduction type formed directly or through a semiconductor layer on the surface of the substrate, a semiconductor active layer formed on the first semiconductor cladding layer, and a second semiconductor cladding layer of a second electroconduction type opposite in polarity to the first electroconduction type which is formed on the semiconductor active layer.

The active layer is different in lattice constant from at least one of the first and second cladding layers. A laser beam is emitted in the direction approximately perpendicular to the surface of the substrate.

The active layer may be the same or different in lattice constant from the substrate.

The first electroconduction type means one of n- and p-types and the second electroconduction type means the other.

With the surface-light-emitting semiconductor device of the present invention, the active layer is different in lattice constant from at least one of the first and second cladding layers, so that lattice strain occurs in the semiconductor layers in which the lattice constants are different from each other. The lattice strain thus occurring causes the band-gap of the active layer to be changed in accordance with an orbital-strain interaction thereby to exert an influence on the polarization for the optical transition, so that the polarization direction of a laser beam emitted can be confined to one direction.

Additionally, when the surface-emitting semiconductor device is optically coupled with any other optical circuit element, a high coupling efficiency can be provided.

In a preferred embodiment, an optical waveguide formed by the active layer and the first and second cladding layers has a rectangular cross-section parallel to the surface of the substrate. In this case, there is an advantage that the polarization direction of the laser light emitted is controlled by the asymmetrical device configuration in addition to the lattice strain as described above and as a result, the polarization can be outstandingly stabilized so that it is difficult to be destabilized by any influence such as an external stress.

DETAILED DESCRIPTION OF THE PREFERRED EMBODIMENTS

Preferred embodiments of the present invention will be described below with reference to the drawings attached.

[First Embodiment]

Figure 1A:
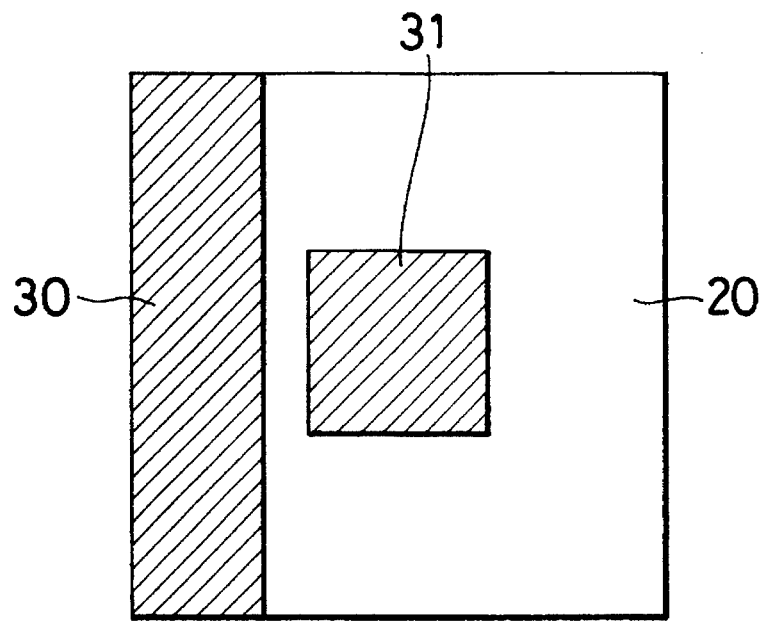
FIGS. 1A and 1B are top and cross-sectional views showing a structure of a surface-emitting-semiconductor device according to a first embodiment of the present invention, respectively.
Figure 1B:
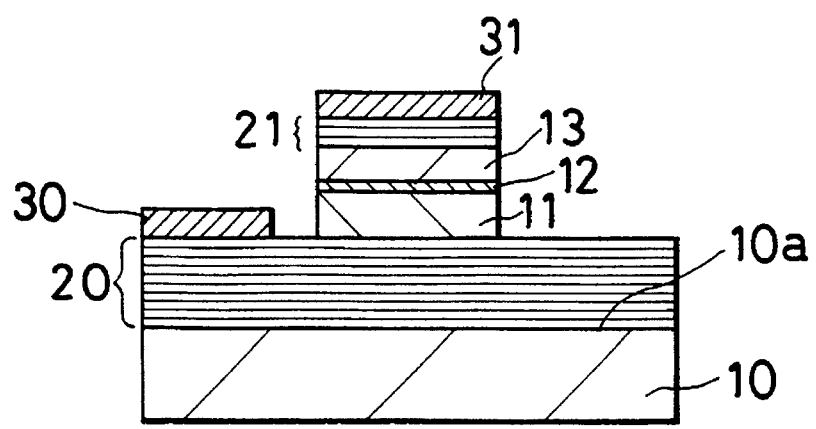

In a surface-emitting semiconductor laser according to a first embodiment shown in FIGS. 1A and 1B, on an upper surface 10a of an n-type GaAs substrate 10 which is square in shape, an n-type GaAs/AlAs multilayer reflection film 20 is formed over the entire surface 10a. The surface 10a of the substrate 10 makes an inclination of two (2) degrees crystallographically toward the (111A)-plane from the (100)-plane.

A mesa portion whose cross-section parallel to the substrate 10 is square in shape is formed at substantially the center of the upper surface of the reflection film 20. The mesa portion is composed of an n-type GaAs cladding layer 11 formed on the reflection film 20, an $In_{0.2}Ga_{0.8}As$ strained quantum well active layer 12 with a thickness of 80 Å formed on the cladding layer 11, a p-type GaAs cladding layer 13 formed on the active layer 12, and a p-type GaAs/AlAs multilayer reflection film 21 formed on the cladding layer 13.

The $In_{0.2}Ga_{0.8}As$ strained quantum well active layer 12 is different in lattice constant from the n-type GaAs substrate 10 and the n-type GaAs cladding layer 11.

There is formed an anode electrode 31 which can serve as a metal reflection film on the p-type GaAs/AlAs multilayer reflection film 21.

The n-type GaAs/AlAs multilayer reflection layer 20 has an exposed surface area surrounding the mesa portion provided in a square pillar shape, and a cathode electrode 30 is partially formed on the exposed surface thereof.

The n- and p-types GaAs/AlAs multilayer reflection films 20 and 21 may be formed of any material with a high reflectivity other than semiconductors such as dielectrics, respectively.

A production method of the surface-emitting semiconductor laser as described above will be explained below.

First, on the n-type GaAs substrate 10 are grown the n-type GaAs/AlAs multilayer reflection film 20, the n-type GaAs cladding layer 11, the $In_{0.2}Ga_{0.8}As$ strained quantum well active layer 12, the p-type GaAs cladding layer 13 and the p-type GaAs/AlAs multilayer reflection film 21 in this order by a Molecular Beam Epitaxy (MBE) technique.

Subsequently, the side faces of the p-type multilayer reflection film 21, the p-type cladding layer 13, the active layer 12 and the n-type cladding layer 11 are selectively removed by lithography and etching techniques thereby to form the mesa portion. The upper surface of the multilayer reflection film 20 is selectively exposed through this process.

Then, the anode electrode 31 is formed on the upper surface of the p-type GaAs/AlAs multilayer reflection film 21 by a vacuum evaporation technique. Besides, the cathode electrode 30 is formed on the exposed upper surface of the n-type GaAs/AlAs multilayer reflection film 20 by the same technique, or a vacuum evaporation one. Consequently, the surface-emitting semiconductor laser according to the first embodiment can be obtained.

With the surface-emitting semiconductor laser of the embodiment, the lattice constant of the $In_{0.2}Ga_{0.8}As$ strained quantum well active layer 12 is made different from those of the n-type GaAs substrate 10 and the n-type GaAs cladding layer 11 so that, a lattice strain will be generated in the layers 12 and 11. Here, supposing that two-degree off direction from the [100]-direction toward the (111A)-plane which is the crystal growth direction and is the same as the lattice direction of the n-type GaAs substrate 10 is defined as x, the two-degree off direction from the [011]-direction is defined as y, and the [0$\bar{1}$1]-direction is expressed as z and the strain thus generated is defined as $\epsilon$, the tensor element $\epsilon_{xy}$ of the shearing strain $\epsilon$ is less than zero or, $\epsilon_{xy}<0$. On the other hand, the other tensor elements $\epsilon_{zx}$ and $\epsilon_{yz}$ thereof are given as $\epsilon_{zx}=\epsilon_{yz}=0$. This means that the strain is asymmetric.

The strain containing only the tensor element $\epsilon_{xy}$ causes the band-gap to be changed in accordance with the orbital-strain interaction thereby to exert an influence upon the polarization for the optical transition. As a result, a light wave having a polarization direction parallel to the x-y plane is liable to be oscillated, and then the polarization direction of a laser light emitted is confined to the two-degree off direction from the [011]-direction, that is, the y-axis direction. The laser beam is emitted through the n-type GaAs substrate 10 in the vertical downward direction perpendicular to the substrate 10.

Additionally, due to the improved definition of the polarization direction of the laser light, a high optical coupling efficiency can be obtained when the laser is optically coupled with any other optical circuit element.

Figure 2:
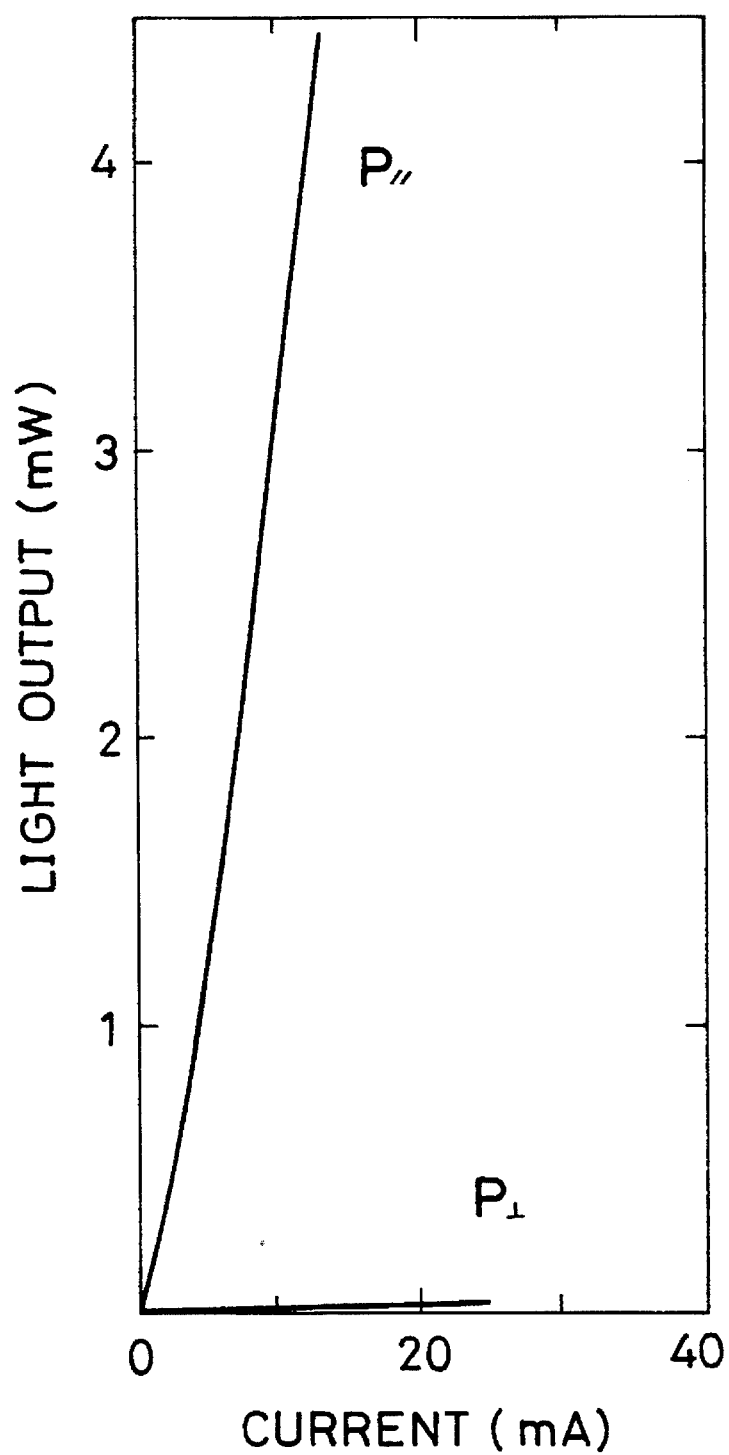
FIG. 2 is a diagram showing the threshold current-light output characteristics obtained in the first embodiment.

FIG. 2 is a diagram showing the measurement result on the injection current-light output characteristics in the embodiment, in which the abscissa indicates the injection current and the ordinate indicates the light output. It is seen that from FIG. 2 the oscillating threshold current is 1 mA or less. The polarization of the light emitted by the laser is substantially parallel to the [011]-direction, which is shown by the curve indicated by the symbol P//. The orthogonal polarization thereto is shown by the curve indicated by the symbol P⊥.

If the light intensity of the polarization P⊥ is defined as 1, that of the polarization P// is relatively 100, or P⊥: P//= 1:100, which means that the laser light emitted is in a superior linear polarization.

In addition, the mesa portion is made in a square pillar shape, but is not limited thereto, as it may be formed in any other shape.

Further in addition, the $In_{0.2}Ga_{0.8}As$ strained quantum well active layer 12 is different in lattice constant from the n-type GaAs substrate 10 and the n-type GaAs layer 11 in the embodiment, however, it is not limited thereto, the same effects can be obtained when it is made different in lattice constant from at least one of the n-type multilayer reflection film 20 and the p-type cladding layer 13 by changing semiconductor materials which form the multilayer reflection film 20 and the cladding layer 13.

[Second Embodiment]

Next, a second embodiment of the present invention will be described below with reference to FIGS. 3A and 3B.

A surface-emitting semiconductor laser of the second embodiment is similar in configuration to the first embodiment excepting that a cross-section parallel to a substrate 40 of a mesa portion is rectangular in shape and that the shape of the substrate 40 is also rectangular according to the mesa portion.

Figure 3A:
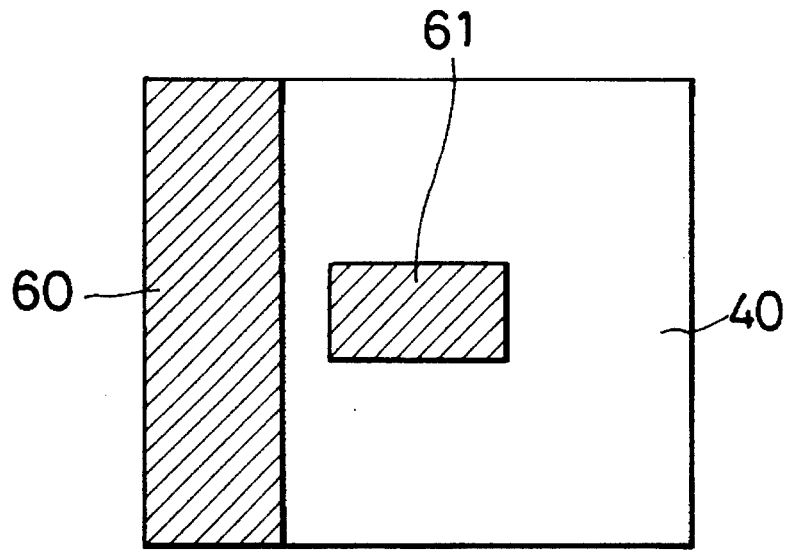
FIGS. 3A and 3B are top and cross-sectional views showing a structure of a surface-emitting semiconductor device according to a second embodiment of the present invention, respectively.
Figure 3B:
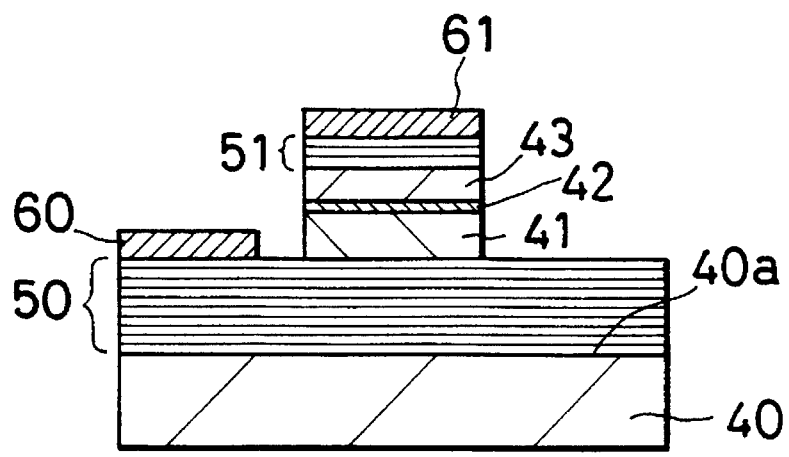

In FIGS. 3A and 3B, on the upper surface 40a of the n-type GaAs substrate 40, an n-type GaAs/AlAs multilayer reflection film 50 is formed. The upper surface 40a of the substrate 10 has the same crystallographical inclination as that of the first embodiment. The mesa portion in a rectangular pillar shape, which is formed of an n-type GaAs cladding layer 41, an $In_{0.2}Ga_{0.8}As$ strained quantum well active layer 42 with a thickness of 80 Å, a p-type GaAs cladding layer 43 and a p-type GaAs/AlAs multilayer reflection film 51 formed in this order, is provided substantially at the center of the multilayer reflection film 50. An anode electrode 61 which can serve as a metal reflection film is formed on the p-type GaAs/AlAs multilayer reflection film 51. A cathode electrode 60 is partially formed on the exposed surface area surrounding the mesa portion of the n-type GaAs/AlAs multilayer reflection layer 40.

The $In_{0.2}Ga_{0.8}As$ strained quantum well active layer 42 is different in lattice constant from the n-type GaAs substrate 40 and the n-type GaAs cladding layer 41.

The production method of the laser of this embodiment is the same as that of the first embodiment.

With the surface-emitting semiconductor laser of this embodiment, an asymmetrical device structure, namely, the mesa portion having a cross-sectional shape of a rectangle consisting of major (relatively long) and minor (relatively short) sides is introduced thereinto, so that both of the polarization control due to the asymmetrical device structure and that due to the lattice strain as described in the first embodiment are employed. As a result, the polarization of the laser light can be more stabilized so that it is difficult to be destabilized by any influence such as an external stress.

In the present invention, semiconductor materials to be used are not limited to those of the above-mentioned GaAs system, and any other semiconductor materials such as InP system ones may be used therefore.

What is claimed is:

1. In a surface-emitting semiconductor device comprising:

a semiconductor substrate having a surface inclined with its (100)-plane;

a first semiconductor cladding layer of a first electroconduction type formed directly or through a semiconductor layer on said surface of said substrate;

a semiconductor active layer formed on said first semiconductor cladding layer; and a second semiconductor cladding layer of a second electroconduction type opposite in polarity to said first electroconduction type, said second semiconductor cladding layer being formed on said semiconductor active layer;

the improvement wherein said active layer is different in lattice constant from at least one of said first and second cladding layers, and a laser beam is emitted in a direction approximately perpendicular to said surface of said substrate, whereby the polarization direction of the laser beam is confined to a specific direction.

2. A surface-emitting semiconductor device as claimed in claim 1, wherein an optical waveguide formed by said semiconductor active layer, said first semiconductor cladding layer and said second semiconductor cladding layer has a cross-section parallel to said surface of said semiconductor substrate, and a first length along a first direction of said cross-section is different from a second length along a second direction perpendicular to said first direction.

3. A surface-emitting semiconductor device as claimed in claim 1, wherein an optical waveguide formed by said semiconductor active layer, said first semiconductor cladding layer and said second semiconductor cladding layer has a rectangular cross-section parallel to said surface of said semiconductor substrate.

4. A surface-emitting semiconductor device as claimed in claim 1, further comprising:

a first reflection layer formed between said semiconductor substrate and said first semiconductor cladding layer, said first reflection layer being adjacent to said first semiconductor cladding layer; and a second reflection layer formed on an opposite side to said semiconductor substrate, said second reflection layer being adjacent to said second semiconductor cladding layer.

5. A surface-emitting semiconductor device as claimed in claim 4, further comprising:

a mesa portion formed of said first semiconductor cladding layer, said semiconductor active layer and said second semiconductor cladding layer;

a first electrode formed on an exposed surface area of said first reflection layer; and a second electrode formed on said second reflection layer.

6. A surface-emitting semiconductor device as claimed in claim 5, wherein said first reflection layer and said second reflection layer each is made of a semiconductor multilayer film.

7. A surface-emitting semiconductor device as claimed in claim 5, wherein said second electrode has a function of optical reflection.

8. A surface-emitting semiconductor device as claimed in claim 5, wherein said semiconductor active layer is an $In_{0.2}Ga_{0.8}As$ strained quantum well layer, and said first semiconductor cladding layer is a GaAs layer of said first electroconduction type and said second semiconductor cladding layer is a GaAs layer of said second electroconduction type.

9. A surface-emitting semiconductor device as claimed in claim 8, wherein said first and second reflection layers each is a GaAs/AlAs multilayer film.

10. In a surface-emitting semiconductor device comprising:

a semiconductor substrate having a surface inclined with its (100)-plane;

a first reflection layer formed on said surface of said semiconductor substrate;

a first semiconductor cladding layer of a first electroconduction type formed on said first reflection layer;

a semiconductor active layer formed on said first semiconductor cladding layer;

a second semiconductor cladding layer of a second electroconduction type opposite in polarity to said first electroconduction type, said second semiconductor cladding layer being formed on said semiconductor active layer;

a second reflection layer formed on said second semiconductor cladding layer;

said first semiconductor cladding layer, said semiconductor active layer, said second semiconductor cladding layer and said second reflection layer being of a mesa structure;

a first electrode formed on an exposed surface area of said first reflection layer; and a second electrode formed on said second reflection layer;

the improvement wherein said active layer is different in lattice constant from at least one of said first and second cladding layers, and a laser beam is emitted in a direction approximately perpendicular to said surface of said substrate, whereby the polarization direction of the laser beam is confined to a specific direction.

11. A surface-emitting semiconductor device as claimed in claim 10, wherein an optical waveguide formed by said semiconductor active layer, said first semiconductor cladding layer and said second semiconductor cladding layer has a cross-section parallel to said surface of said semiconductor substrate, and a first length along a first direction of said cross-section is different from a second length along a second direction perpendicular to said first direction.

12. A surface-emitting semiconductor device as claimed in claim 10, wherein an optical waveguide formed by said semiconductor active layer, said first semiconductor cladding layer and said second semiconductor cladding layer has a rectangular cross-section parallel to said surface of said semiconductor substrate.

13. A surface-emitting semiconductor device as claimed in claim 12, wherein said first reflection layer and said second reflection layer each is made of a semiconductor multilayer film.

14. A surface-emitting semiconductor device as claimed in claim 10, wherein said semiconductor active layer is an $In_{0.2}Ga_{0.8}As$ strained quantum well layer, and said first semiconductor cladding layer is a GaAs layer of said first electroconduction type and said second semiconductor cladding layer is a GaAs layer of said second electroconduction type.

15. A surface-emitting semiconductor device as claimed in claim 14, wherein said first and second reflection layers each is a GaAs/AlAs multilayer film.

16. A surface-emitting semiconductor device as claimed in claim 10, wherein said second electrode has a function of optical reflection.

* * * * *